(12) United States Patent
Lee et al.

(10) Patent No.: US 8,187,480 B2
(45) Date of Patent: May 29, 2012

(54) ULTRA THIN ALIGNMENT WALLS FOR DI-BLOCK COPOLYMER

(75) Inventors: Kim Yang Lee, Fremont, CA (US); David S. Kuo, Palo Alto, CA (US); Dorothea Buechel, Pittsburgh, PA (US); Kalman Pelhos, Pittsburgh, PA (US)

(73) Assignee: Seagate Technology, LLC, Cupertino, CA (US)

( * ) Notice: Subject to any disclaimer, the term of this patent is extended or adjusted under 35 U.S.C. 154(b) by 389 days.

(21) Appl. No.: 12/270,511

(22) Filed: Nov. 13, 2008

(65) Prior Publication Data

US 2010/0119778 A1 May 13, 2010

(51) Int. Cl.
*B44C 1/22* (2006.01)

(52) U.S. Cl. .......................................... 216/22; 257/414

(58) Field of Classification Search .................. 216/22, 216/49, 58, 41, 39; 428/167, 332
See application file for complete search history.

(56) References Cited

U.S. PATENT DOCUMENTS

| 6,011,664 | A | 1/2000 | Kryder et al. | |
|---|---|---|---|---|
| 2006/0211260 | A1* | 9/2006 | Tran et al. | 438/763 |
| 2007/0170146 | A1 | 7/2007 | Huang et al. | |
| 2007/0215960 | A1* | 9/2007 | Zhu et al. | 257/414 |
| 2009/0186234 | A1* | 7/2009 | Colburn et al. | 428/500 |

FOREIGN PATENT DOCUMENTS

WO 2008/033695 A2 3/2008
WO 2008/097736 A2 8/2008

OTHER PUBLICATIONS

Boal et al., "Self-Assembly of Nanoparticles Into Structured Spherical and Network Aggregates," Nature, vol. 404, Issue No. 6779, pp. 746-748, Apr. 13, 2000.
Chen et al., "Templated Self-Assembly of Block Copolymers Effect of Substrate Topography," Advanced materials, vol. 15, No. 19, Oct. 2, 2003.
Schaffer et al., "Electrically Induced Structure Formation and Pattern Transfer," Nature vol. 403, No. 6772, pp. 874-877, Feb. 24, 2000.
Thurn-Albrecht et al., "Ultrahigh Density Nanowire Arrays Grown in Self-Assembled Diblock Copolymer Templates," Science, vol. 290, No. 5499, pp. 2126-2129, Dec. 15, 2000.
Thrun-Albrecht et al., "Overcoming Interfacial Interactions with Electric Fields," Macromolecules, vol. 33, No. 9, pp. 3250-3253, May 2, 2000.
Reply to Written Opinion of international application No. PCT/US2009/064448, dated Sep. 13, 2010, 2 pp.
International Search Report and Written Opinion of corresponding PCT Application No. PCT/US2009/064448 dated Dec. 22, 2009 (14 pages).

* cited by examiner

*Primary Examiner* — Binh X Tran
*Assistant Examiner* — David Cathey, Jr.
(74) *Attorney, Agent, or Firm* — Ladas & Parry, LLP

(57) ABSTRACT

Methods comprising providing a pre-patterned substrate having an array of thick walls, depositing a conforming layer on the pre-patterned substrate, etching the conforming layer from the top of the thick walls and the space between the walls, and etching the thick walls while leaving thin walls of conforming layer.

20 Claims, 8 Drawing Sheets

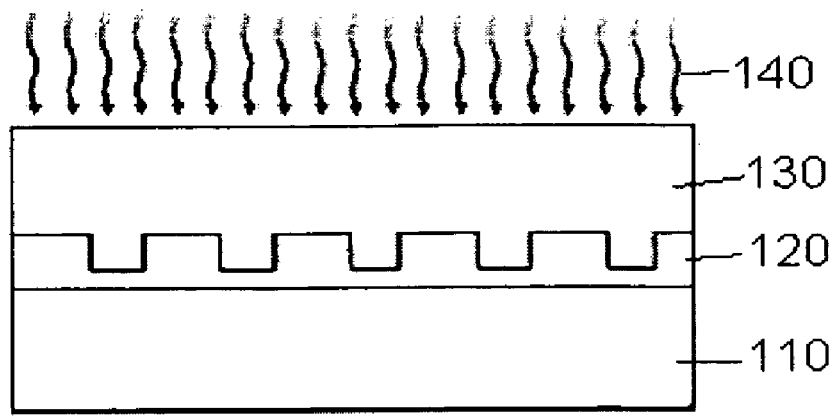
Fig. 1a
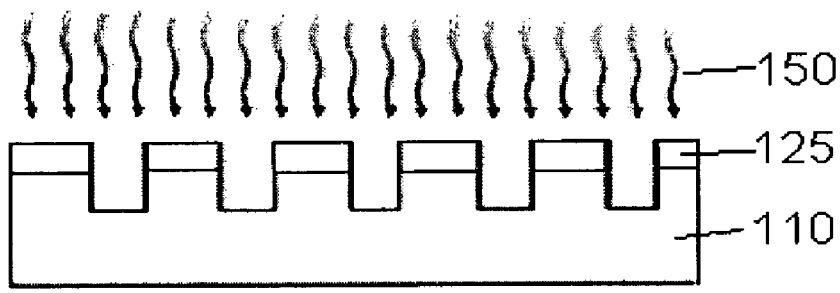
Fig. 1b
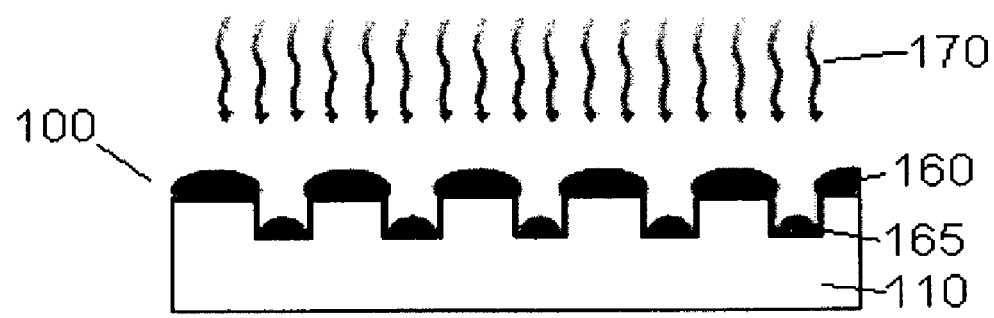
Fig. 1c
Fig. 1

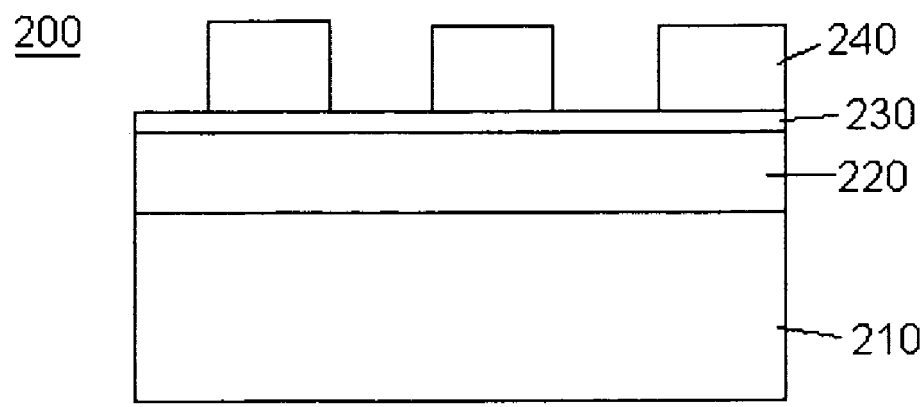
Fig. 2a
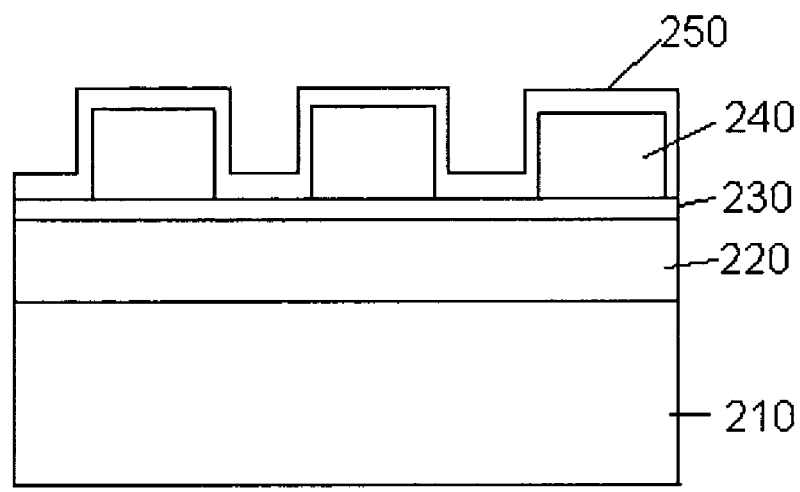
Fig 2b
Fig. 2

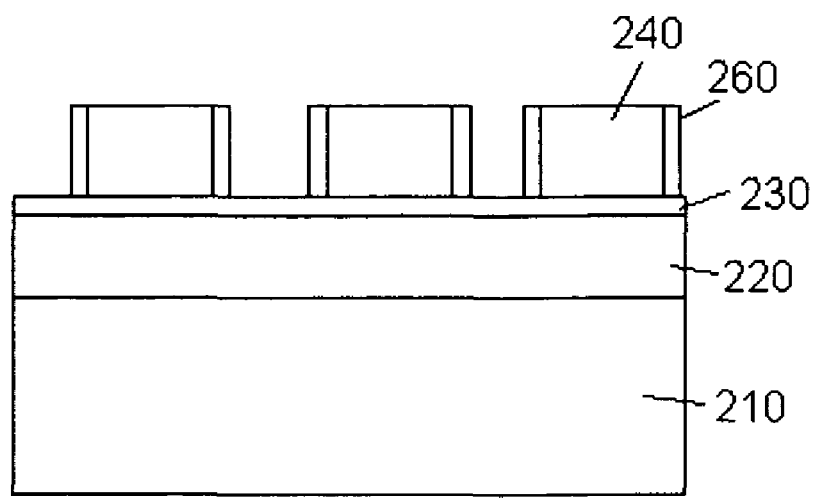
Fig. 2c
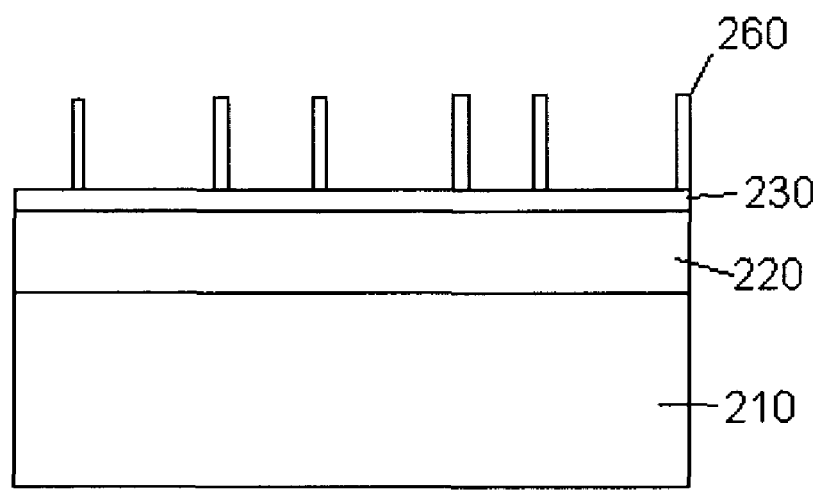
Fig. 2d
Fig. 2

205

1) Starting substrate and layers (use same numbering as disclosure)

2) Conformal coating as described in disclosure

3) Thin wall formation

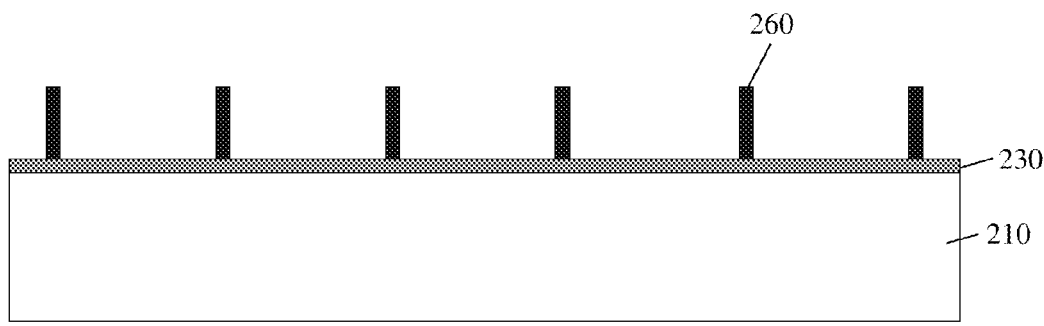
4) Thin wall formation (continued)
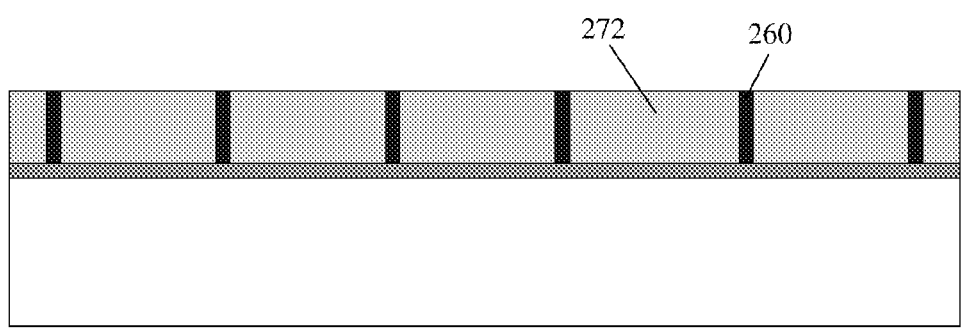
5) DBCP coating
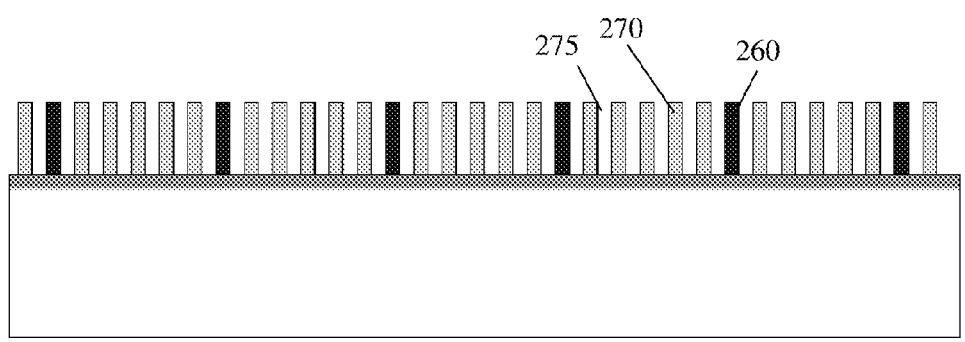
6) DBCP microphase separation to form cylindrical pillars 7) Transfer pattern into Cr layer by reactive-ion etching 8) Transfer pattern into quartz by RIE (e.g. using CF4 plasma)

9) Remove Cr mask by wet etching

US 8,187,480 B2

ULTRA THIN ALIGNMENT WALLS FOR DI-BLOCK COPOLYMER

BACKGROUND

The superparamagnetic effect poses a serious challenge for continuing to increase the areal density and storage capacity of disk drives. One of the most promising methods to circumvent the density limitations imposed by this is the use of patterned media. In conventional media, the magnetic recording layers is a thin film of magnetic alloy, which naturally forms a random mosaic of nanometer scale grains which behave as independent magnetic elements. Each recorded bit is made up of many of these random grains. In pattern and media, the magnetic layer is created as an ordered array of highly uniform islands, each island capable of storing an individual bit.

In conventional media, bit cells are fabricated on circular tracks on a disk. Each bit cell comprises many tiny magnetic grains. Each grain behaves like an independent magnet whose magnetization can be flipped by a write head during the data writing process. These grains are irregularly shaped and randomly oriented. If the grains are small relative to the size of the bit cell, the magnetic transitions are straight enough so that it is easy to detect the boundary between adjacent bit cells. Shrinking the bit cells to increase areal density, however, without shrinking the grain size makes the magnetic transitions harder to detect.

The traditional solution to this problem has been to shrink the grain size. However, there is a practical limit. The magnetization of very small grains is unstable. According to the superparamagnetic effect, the magnetization of a grain can flip spontaneously if the product of the grain volume and its anisotropy energy falls below a certain value. The result is a loss of data.

In patterned media, each bit is stored in a single deliberately formed magnetic switching volume. This may be one grain, or several exchange volume coupled grains, rather than a collection of random decoupled grains. Single switching volumes magnetic islands are formed along circular tracks with regular spacing. Magnetic transitions no longer meander between random grains but are distinct boundaries between precisely located islands.

SUMMARY

An embodiment of the present invention provides a method comprising providing a pre-patterned substrate having an array of thick walls, depositing a conforming layer on the pre-patterned substrate, etching the conforming layer from the top of the thick walls and the space between the walls, and etching the thick walls while leaving thin walls of conforming layer.

Preferred embodiments of this invention is shown and described, simply by way of illustration of the best mode contemplated for carrying out this invention, in the following detailed description. As will be realized, this invention is capable of other and different embodiments, and its details are capable of modifications in various obvious respects, all without departing from this invention. Accordingly, the drawings and description are to be regarded as illustrative in nature and not as restrictive.

BRIEF DESCRIPTION OF THE DRAWINGS

FIG. 1 is a schematic illustration of a method of fabricating patterned storage media according to one aspect of the invention.

FIG. 2a is a schematic illustration of a step in a method of fabricating thin walls for aligning diblock copolymers according to one aspect of the invention.

FIG. 2b is a schematic illustration of a step in a method of fabricating thin walls for aligning diblock copolymers according to one aspect of the invention.

FIG. 2c is a schematic illustration of a step in a method of fabricating thin walls for aligning diblock copolymers according to one aspect of the invention.

FIG. 2d is a schematic illustration of a step in a method of fabricating thin walls for aligning diblock copolymers according to one aspect of the invention.

FIG. 7d is a schematic illustration of a step in a method of fabricating a nano-stamper according to one aspect of the invention.

FIG. 7e is a schematic illustration of a step in a method of fabricating a nano-stamper according to one aspect of the invention.

FIG. 7f is a schematic illustration of a step in a method of fabricating a nano-stamper according to one aspect of the invention.

DETAILED DESCRIPTION

Figure 3:
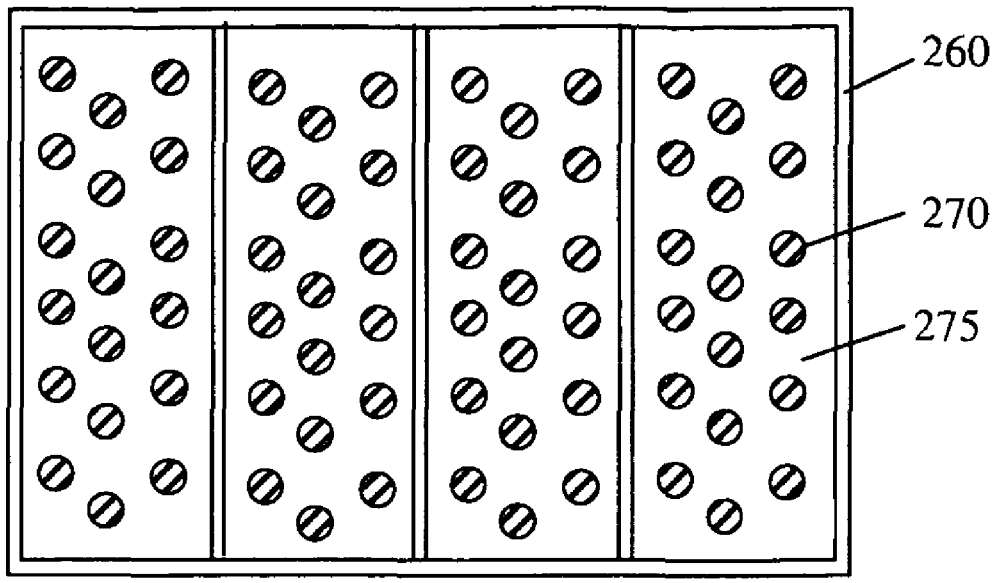
FIG. 3 is a plan view of a step in a method of fabricating a hard mask according to one aspect of the invention.

An embodiment of the present invention provides a method comprising providing a pre-patterned substrate having an array of thick walls, depositing a conforming layer on the pre-patterned substrate, etching the conforming layer from the top of the thick walls and the space between the walls, and etching the thick walls while leaving thin walls of conforming layer.

Another embodiment of the present invention includes a device comprising a substrate and an array of thin walls on the substrate, wherein the thin walls have a thickness of about 5 nm or less.

Another embodiment of the present invention includes a device comprising a substrate a pattern transfer layer on the substrate and an array of holes in the pattern transfer layer, wherein the holes are aligned with an array of regions lacking holes, and wherein the regions lacking holes have a thickness of about 5 nm or less.

EXAMPLES

FIG. 1 illustrates one proposed method for fabricating patterned media 100. A thin layer of UV-curable photoresist 120 is spread on the surface of a substrate 110. A transparent hard mask (or stamper) 130 is then pressed into the photoresist layer 120. While the hard mask 130 is in contact with the resist, UV light 140 is shown through the hard mask 130 onto the substrate 110. The photoresist 120 hardens, creating a relief pattern of hardened photoresist 125 matching the surface of the hard mask 130. The patterned resist 125 is then etched, typically with a reactive ion etching plasma 150, generating an array of pillars in the substrate 110. A magnetic recording material 170 is then deposited on the surface of the etched substrate. The magnetic material on top array of pillars forms discrete magnetic islands 160. Base magnetic material 165 at the bottom of the pillars does not play a role in the recording process because it is too far away from the magnetic write field.

FIGS. 2a to 2d illustrate a method of fabricating thin walls for aligning diblock copolymers according to one aspect of the invention. In this embodiment, a pre-patterned substrate 200 comprising a substrate 210, a pattern transfer layer 220, an etch stop 230, and patterned thick walls 240 is provided (FIG. 2a). Typically, the patterned thick walls 240 are approximately 50 nm to 100 nm thick, however, the patterned thick walls 240 may be larger. The pre-patterned substrate 200 may be produced by conventional semiconductor processes. These processes include, but are not limited to, chemical vapor deposition (CVD), organometallic chemical vapor deposition, (OMCVD), physical vapor deposition (PVD), atomic layer deposition (ALD), molecular beam epitaxy (MBE), liquid phase epitaxy (LPE), chemical etching, reactive ion etching (RIE), plasma etching, photolithography, and ion beam lithography.

A conforming layer 250 is deposited onto the pre-patterned substrate 200 (FIG. 2b). The conforming layer may be deposited by any deposition technique that provides essentially uniform thickness. Preferably, the conforming layer is uniformly thick along the sidewalls of the patterned thick walls 240. Deposition techniques include, but are not limited to, CVD, OMCVD, PVD, ALD, MBE, and LPE. In one aspect of the invention, the pattern transfer layer 220 comprises $SiO_x$, the etch stop 230 comprises Cr, the patterned thick walls 240 comprises Al, and the conforming layer 250 comprises SiN. These compositions are by way of example only and are not meant to be limiting.

In the next step (FIG. 2c), the conforming layer 250 is etched off the top of the patterned thick wall 240 and the etch stop 230. However, conforming layer material along the sidewalls of the patterned thick walls 240 remains. This results in the fabrication of thin walls 260 of conforming layer material.

In the final step of this embodiment of the invention, the patterned thick walls 240 are preferentially etched away. This results in an array of thin walls 260 of conforming layer material. Preferential etching may be performed by any suitable method, for example RIE. The thickness of the thin walls 260 is determined by the conforming film deposition process and may be extremely thin. Preferably, the thickness of the thin walls 260 may be approximately 5 nm or less. More preferably, the thickness of the thin walls 260 may be approximately 3 nm or less. Even more preferably, the thickness of the thin walls 260 may be approximately 1 nm or less.

FIGS. 3-6 illustrate another embodiment of the invention. Specifically, FIGS. 3-6 illustrate a method of fabricating a hard mask according to one aspect of the invention. In the first step of this embodiment, a pre-patterned substrate 205 with thin walls 260 is provided. Then, the pre-patterned substrate 205 is coated with a suitable diblock copolymer (DBCP), for example P(S-block-PMMA). The DBCP is then allowed to microphase separate to form domains of a suitable shape. As illustrated in FIG. 3, the DBCP separates to form a cylindrical phase 270 and continuous phase 275. Other known domain shapes include spherical, gyroidal, and lamellar. The choice of domain shape is controlled by several factors including the volume fraction of the various blocks in the DBCP and may be selected depending on the design of the hard mask.

Figure 4:
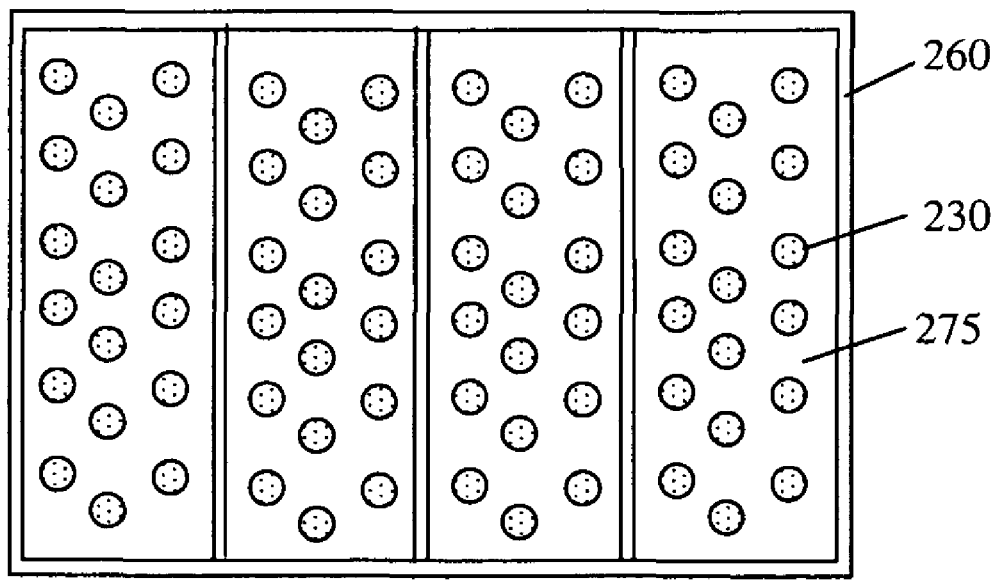
FIG. 4 is a plan view of a step in a method of fabricating a hard mask according to one aspect of the invention.

In the next step, illustrated in FIG. 4, the cylindrical phase 270 is preferentially etched down to the etch stop 230. The selective etching processes can be performed to leave either a positive or a negative image. In the figure, the positive image is produced.

Figure 5:
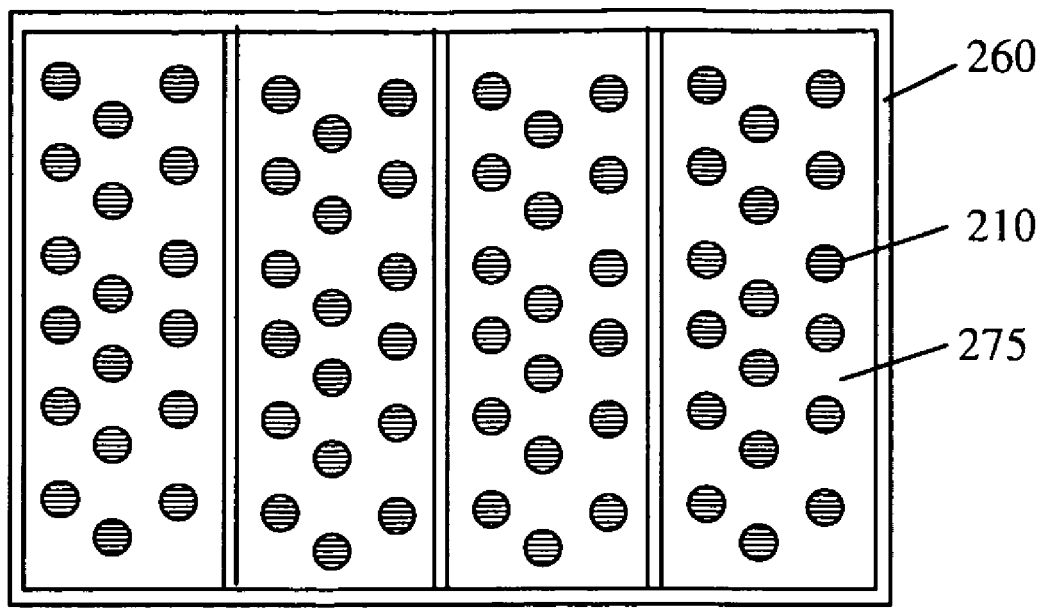
FIG. 5 is a plan view of a step in a method of fabricating a hard mask according to one aspect of the invention.

In the next step, illustrated in FIG. 5, a second preferential etch is performed. In this step, the exposed etch stop material 230 is removed as well as the underlying pattern transfer layer 220. This may be accomplished in a single etching step or a series of steps depending on the etch stop material 230 and the pattern transfer layer 220.

Figure 6:
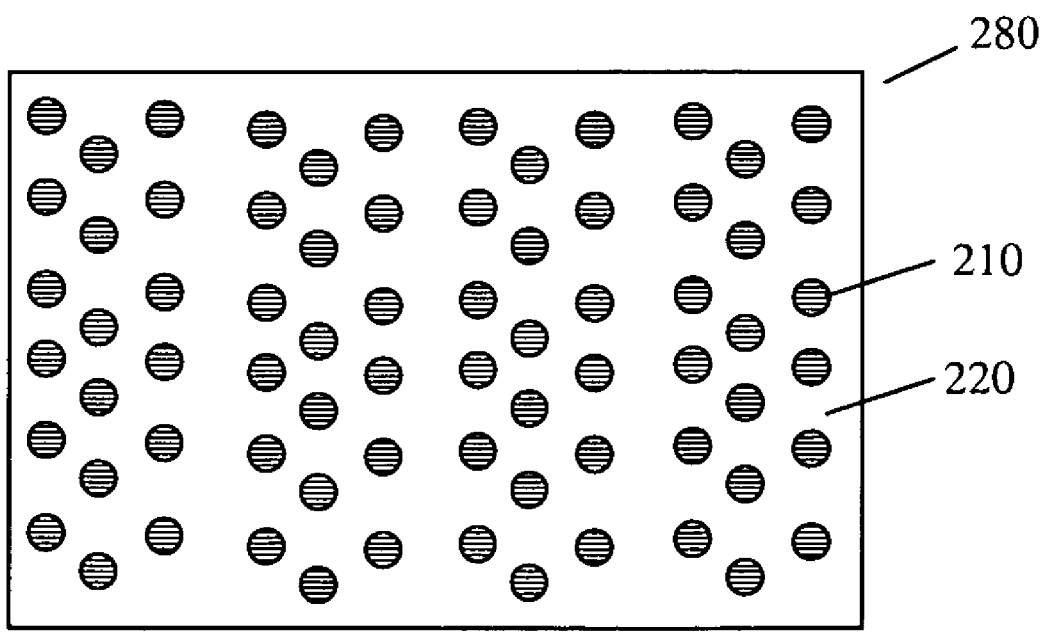
FIG. 6 is a plan view of a step in a method of fabricating a hard mask according to one aspect of the invention.

In the last step, illustrated in FIG. 6, the patterned thin walls 260 and the continuous DBCP phase 275 are removed. The resulting hard mask 280 comprises a substrate having arrays of regularly spaced holes in the pattern transfer layer 220. In another embodiment of the invention, the hard mask 280 can be used to fabricate patterned storage media having nanoscale domains.

Another embodiment of the invention is illustrated in FIGS. 7a-7i. In this embodiment, the final product is a nanoscale hard mask (or stamper) 330 similar to hard mask 130. That is, rather than having holes as in the last embodiment, nano-scale hard mask 300 has pillars suitable for pressing into a photoresist layer. An example for a suitable DBCP is P(S-block-PFS).

In this embodiment of the invention, a pre-patterned substrate 300 is provided. Pre-patterned substrate 300 comprises a transparent substrate 210, an etch stop layer 230, and patterned thick walls 240. Preferably, the substrate is quartz, however any suitable transparent material may be used. Preferably, the etch stop layer comprises chromium, however any suitable metal or alloy material may be used. If the etch stop layer is made of chromium, preferably it is approximately 5 nm thick. The thickness of the etch stop layer, however, may vary depending on the material used.

Figure 7A:
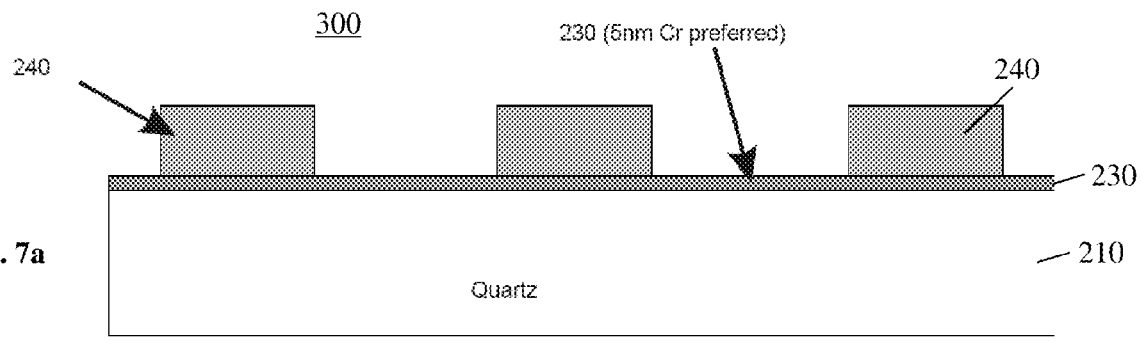
FIG. 7a is a schematic illustration of a step in a method of fabricating a nano-stamper according to one aspect of the invention.
Figure 7B:
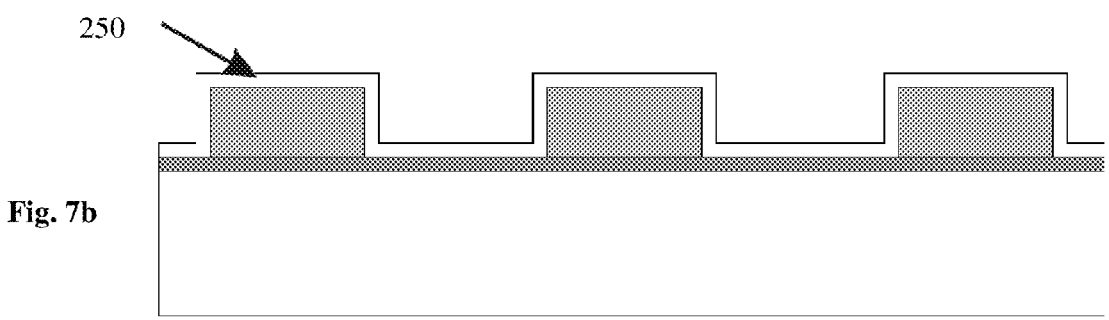
FIG. 7b is a schematic illustration of a step in a method of fabricating a nano-stamper according to one aspect of the invention.
Figure 7C:
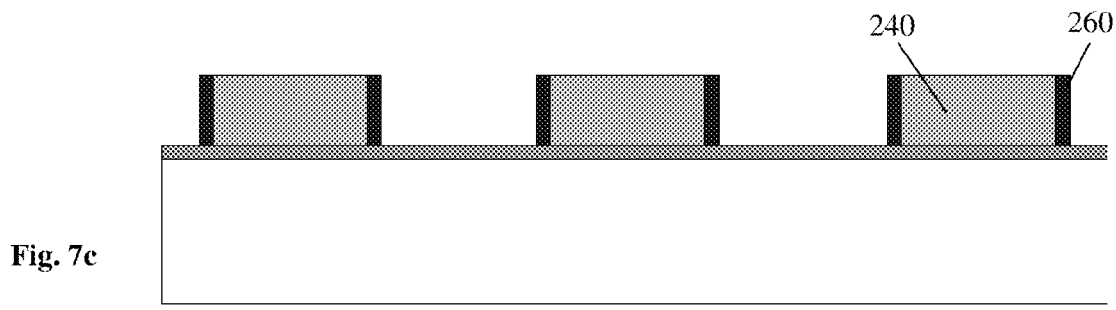
FIG. 7c is a schematic illustration of a step in a method of fabricating a nano-stamper according to one aspect of the invention.

A conforming layer 250 is deposited onto pre-patterned substrate 300 (FIG. 7b). The conforming layer may be deposited by any deposition technique that provides essentially uniform thickness. Preferably, the conforming layer is uniformly thick along the sidewalls of the patterned thick walls 240. Deposition techniques include, but are not limited to, CVD, OMCVD, PVD, ALD, MBE, and LPE. In one aspect of the invention, the patterned thick walls 240 comprises Al and the conforming layer 250 comprises SiN.

In the next step (FIG. 7c), the conforming layer 250 is etched off the top of the patterned thick wall 240 and the etch stop 230. However, conforming layer material along the sidewalls of the patterned thick walls 240 remains. This results in the fabrication of thin walls 260 of conforming layer material.

In the next step (FIG. 7d) of this embodiment of the invention, the patterned thick walls 240 are preferentially etched away. This results in an array of thin walls 260 of conforming layer material. Preferential etching may be performed by any suitable method, for example RIE. The thickness of the thin walls 260 is determined by the conforming film deposition process and may be extremely thin. Preferably, the thickness of the thin walls 260 may be approximately 5 nm or less. More preferably, the thickness of the thin walls 260 may be approximately 3 nm or less. Even more preferably, the thickness of the thin walls 260 may be approximately 1 nm or less.

In the next step (FIG. 7e), a suitable diblock copolymer (DBCP) 272, for example P(S-block-PFS) is deposited on the etch stop 230 between the thin walls 260. The DBCP 272 is then allowed to microphase separate to form domains of a suitable shape. As illustrated in FIG. 7f, the DBCP separates to form a cylindrical phase 270 and continuous phase 275. Other known domain shapes include spherical, gyroidal, and lamellar. The choice of domain shape is controlled by several factors including the volume fraction of the various blocks in the DBCP and may be selected depending on the design of the hard mask.

Figure 7G:
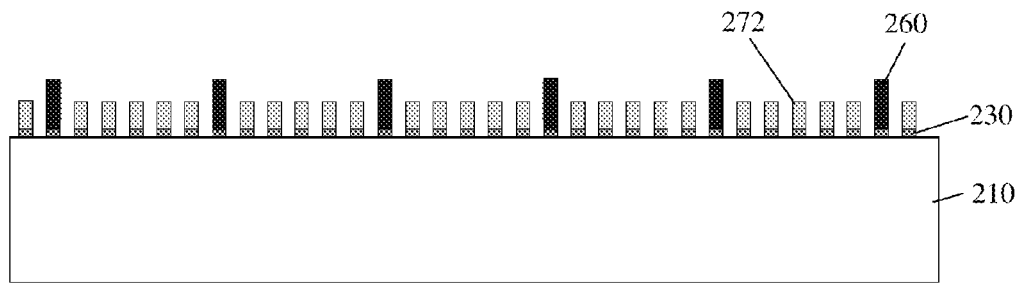
FIG. 7g is a schematic illustration of a step in a method of fabricating a nano-stamper according to one aspect of the invention.

In the next step, illustrated in FIG. 7g, the continuous phase 275 is selectively etched down to the transparent substrate 210. That is, the etch stop 230 under the continuous phase 275 is etched away as well. Selective etching of the continuous phase 275 and the etch stop 230 may be performed with the same selective etch or in two steps under different etching conditions. The final result of this step is a pattern of cylindrical pillars comprising etch stop 230 material and cylindrical DBCP phase 270.

Figure 7H:
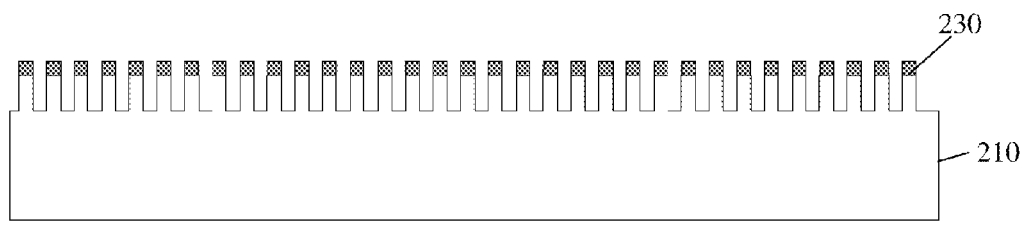
FIG. 7h is a schematic illustration of a step in a method of fabricating a nano-stamper according to one aspect of the invention.
Figure 7I:
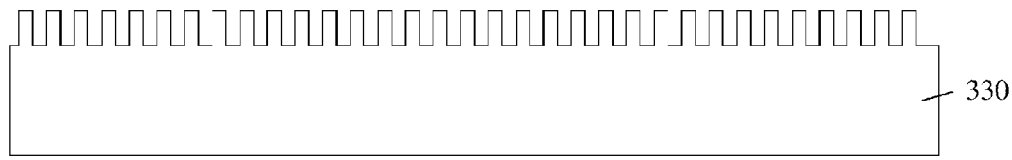
FIG. 7i is a schematic illustration of a step in a method of fabricating a nano-stamper according to one aspect of the invention.

In the next step, illustrated in FIG. 7h, another preferential etch is performed. In this step, the underlying transparent substrate 210 is etched. As illustrated, the cylindrical DBCP phase 270 is also removed in this step. The removal of the cylindrical DBCP phase 270, however, may be accomplished in a separate etching step.

In the final step, the etch stop 230 is removed from the substrate 210. The result is a transparent nano-scale hard mask 330. The nano-scale hard mask 330 is suitable for use in nano-imprint lithography. It can, for example, be used in the method illustrated in FIG. 1 to produce storage media having nano-scale domains.

The implementations described above and other implementations are within the scope of the following claims.

The invention claimed is:

1. A method comprising:
   depositing a conforming layer on a pre-patterned substrate, the substrate having an array of walls each with a pre-determined thickness;
   etching the conforming layer to a top of the walls and between the walls to form conforming layer walls thinner than and adjacent to the array of walls;
   removing the array of walls;
   depositing a diblock copolymer on the substrate between the thinner conforming layer walls;
   allowing the diblock copolymer to phase separate into a continuous phase and a discrete phase, the discrete phase comprising an array of domains aligned with the thinner conforming layer walls;
   etching away one phase of the diblock copolymer;
   etching the pre-patterned substrate using the other one of the phases of the diblock copolymer as a resist pattern; and
   removing the other one of the phases of the diblock copolymer and the thinner conforming layer walls, wherein the etched pre-patterned substrate forms an imprint stamp for fabricating a magnetic storage device.

2. The method of claim 1, wherein the conforming layer thinner wall thickness is less than or equal to 10 nm.

3. The method of claim 1, where the wall thickness is approximately 50-100 nm.

4. The method of claim 1, wherein the conforming layer comprises SiN.

5. The method of claim 1, wherein the thinner walls of conforming layer have thickness of about 5 nm or less.

6. The method of claim 1, wherein the thinner walls of conforming layer have thickness of about 3 nm or less.

7. The method of claim 1, wherein the thinner walls of conforming layer have thickness of about 1 nm or less.

8. The method of claim 1, wherein the diblock copolymer phase separates into cylinders or spheres.

9. The method of claim 1, wherein etching away one component of the diblock copolymer leaves a negative image.

10. The method of claim 2, wherein the magnetic storage device comprises islands of magnetic material corresponding to the cylinders or spheres.

11. A method comprising:
    forming a plurality of walls on a pre-patterned substrate;
    forming one or more domains between each of one or more adjacent pairs of the walls; and
    etching the substrate using the plurality of walls and the one or more domains as a resist pattern to form an imprint stamp for fabricating a magnetic storage device.

12. The method of claim 11, wherein the wall thickness is less than or equal to 10 nm.

13. The method of claim 11, wherein the walls have thickness of about 5 nm or less.

14. The method of claim 11, wherein the walls have thickness of about 1 nm or less.

15. The method of claim 11, wherein the walls are formed by:
    depositing a conforming layer on the pre-patterned substrate, the substrate having a prior array of initial walls;
    etching the conforming layer to a top of the initial walls and between the initial walls, leaving walls of the conforming layer adjacent to the initial walls; and
    removing the initial walls while leaving the walls comprising the conforming layer.

16. The method of claim 11, wherein the conforming layer comprises SiN.

17. The method of claim 11, wherein the regions are formed by:
    depositing a diblock copolymer on the pre-patterned substrate between the walls comprising the conforming layer;
    allowing the diblock copolymer to phase separate into a continuous phase and a discrete phase, the discrete comprising an array of domains aligned with the walls comprising the conforming layer; and
    etching away one of the phases of the diblock copolymer.

18. The method of claim 17, wherein the imprint stamp is formed by:
    etching the substrate using the other one of the phases of the diblock copolymer and the walls as a resist pattern; and
    removing the other one of the phases of the diblock copolymer and the walls.

19. The method of claim 17, wherein etching away the other one of the phases of the diblock copolymer leaves a negative image.

20. The method of claim 18, wherein the magnetic storage device comprises islands of magnetic material corresponding to the domains.

* * * * *